(12) United States Patent
Huang et al.

(10) Patent No.: US 7,258,740 B2
(45) Date of Patent: Aug. 21, 2007

(54) METHOD AND APPARATUS FOR FABRICATING A CRYSTAL FIBER BY UTILIZING AT LEAST TWO EXTERNAL ELECTRIC FIELDS

(75) Inventors: Sheng-Lung Huang, Kaohsiung (TW); Hsiao-Wen Lee, Hsinchu (TW); Chia-Chang Kuo, Kaohsiung (TW); Sheng Bang Huang, Hsihu Township, Changhua County (TW); Tsai-Shuan Chou, Kaohsiung (TW); Li-Min Lee, Chaojhou Township, Pingtung County (TW)

(73) Assignee: National Sun Yat-Sen University, Kaohsiung (TW)

( * ) Notice: Subject to any disclaimer, the term of this patent is extended or adjusted under 35 U.S.C. 154(b) by 313 days.

(21) Appl. No.: 11/106,029

(22) Filed: Apr. 14, 2005

(65) Prior Publication Data
US 2006/0110126 A1   May 25, 2006

(30) Foreign Application Priority Data
Nov. 22, 2004   (TW) .............................. 93135888 A

(51) Int. Cl.
*C30B 15/02* (2006.01)
(52) U.S. Cl. .............................. 117/50; 117/37; 117/47; 117/49; 117/948
(58) Field of Classification Search ................. 117/37, 117/47, 49, 50, 948
See application file for complete search history.

(56) References Cited

U.S. PATENT DOCUMENTS

| | | | |
|---|---|---|---|
| 4,421,721 A | 12/1983 | Byer et al. | |
| 5,171,400 A | 12/1992 | Magel et al. | |
| 5,504,616 A | 4/1996 | Shinozaki et al. | |
| 5,615,041 A * | 3/1997 | Field et al. | 359/326 |
| 5,714,198 A | 2/1998 | Byer et al. | |
| 6,013,221 A | 1/2000 | Byer et al. | |
| 2005/0259940 A1* | 11/2005 | Kuo et al. | 385/147 |

OTHER PUBLICATIONS

Lee et al. "Fabrication and Characterization of ZnO: PPLN Crystal Fiber by Electric-Field Induced Micro-Swing Technique" *CLEO/IQEC* (2004) conference in San Francisco, California, May 21, 2004.

Cho et al. "Fabrication of Nonlinear Photonic Crystal Fiber" *CLEO/Pacific Rim* (2003) The 5th Pacific Rim Conference Lasers and Electro-Optics, Dec. 19, 2003.

* cited by examiner

*Primary Examiner*—Robert Kunemund
(74) *Attorney, Agent, or Firm*—Ladas and Parry LLP

(57) ABSTRACT

The present invention relates to an apparatus for making a source material into a crystal fiber having different regions of polarization inversion. The apparatus of the present invention is similar to a laser-heated pedestal growth (LHPG) apparatus, characterized in that a first electric field generating device and a second electric field generating device are included. The first electric field generating device is used for providing a first external electric field which is used for poling the crystal fiber and inducing micro-swing of the crystal fiber. The second electric field generating device is disposed on a predetermined position above the first electric field generating device for providing a second external electric field to control and maintain the amplitude of the micro-swing. Whereby, the growth condition of the crystal fiber can be controlled precisely, and a uniformly and regularly periodic polarization inversion structure is fabricated.

20 Claims, 8 Drawing Sheets

METHOD AND APPARATUS FOR FABRICATING A CRYSTAL FIBER BY UTILIZING AT LEAST TWO EXTERNAL ELECTRIC FIELDS

BACKGROUND OF THE INVENTION

1. Field of the Invention

The present invention relates to a method and an apparatus for fabricating a crystal fiber, and more particularly, to a method and an apparatus where two external electric fields are applied on the grown crystal fiber during the growth procedure of the crystal fiber so that the growth condition can be controlled precisely.

2. Description of the Related Art

FIG. 1 shows a schematic diagram of a conventional apparatus for fabricating a crystal fiber. The conventional apparatus 10 is similar to a laser heated pedestal growth (LHPG) apparatus, which is used for making a source crystal rod 20 into a crystal fiber 21 having different regions of polarization inversion. The material of the source crystal rod 20 is lithium niobate ($LiNbO_3$). A molten zone 16 is formed between the tip of the source crystal rod 20 and the crystal fiber 21. The conventional apparatus 10 comprises a laser beam generator (not shown), a beam splitter 12, a bending mirror 13, a paraboloidal mirror 14 and a pair of metal electrodes 18,19.

The laser beam generator is used for generating a laser beam 11. The beam splitter 12 includes an outer cone 121 and an inner cone 122. The outer cone 121 has a first conical surface 1211 and the inner cone 122 has a second conical surface 1221, respectively. The beam splitter 12 is used for splitting the laser beam 11 into a generally annular beam 111. The bending mirror 13 is used for reflecting the annular beam 111 from the beam splitter 12 and projecting it to the paraboloidal mirror 14. The paraboloidal mirror 14 is used for reflecting the annular beam 111 from the bending mirror 13, and focusing the annular beam 111 on the molten zone 16 at the tip of the source crystal rod 20. The metal electrodes 18,19 are disposed near the crystal fiber 21 and are parallel to the growth direction of the crystal fiber 21 for providing an external electric field on the molten zone 16. The metal electrodes 18,19 are connected to two high-voltage sources (not shown) respectively for providing a periodic alternating electric field so as to induce micro-swing during the growth procedure of the crystal fiber 21.

FIGS. 2a to 2c show the micro-swing occurred during the growth of the crystal fiber 21, wherein FIG. 2b shows the appearance of the crystal fiber 21 without being applied by any external electric field, FIG. 2a shows that the crystal fiber 21 swings to the left when being applied by an external electric field, and FIG. 2c shows that the crystal fiber 21 swings to the right when being applied by an external electric field. During the growth procedure of the crystal fiber 21, when the lithium niobate crystal is heated to the melting state, negative charges will be induced and distributed on the circumferences of upper portion and lower portion of the molten zone 16 because of the ionization and precipitation of the lithium ions ($Li^+$). The negative charges are attracted by positive electric field and distracted by negative electric field, which causes the micro-swing during the growth procedure of the lithium niobate crystal fiber 21. For one crystal, its displacement is defined as the amplitude of the micro-swing of the crystal fiber 21.

FIG. 3 shows a relationship between the intensity of the external electric field and the total length of the crystal fiber 21 in the conventional apparatus 10. FIG. 4 shows a relationship between the amplitude of the micro-swing and the total length of the crystal fiber 21 in the conventional apparatus 10. The total length L1 of the crystal fiber 21 is the length of the crystal fiber 21 from the molten zone 16. If the intensity of the external electric field is constant, the value of the amplitude of the micro-swing is in direct proportion with the total length L1 of the crystal fiber 21. Accordingly, if the crystal fiber 21 grows freely without changing the intensity of the external electric field, the amplitude of the micro-swing of the crystal fiber 21 will increase continuously until the molten zone 16 breaks. Therefore, as shown in FIG. 3, when the total length L1 of the crystal fiber 21 exceeds a particular value, the intensity of the external electric field must be reduced. Additionally, it is found that the value of the amplitude of the micro-swing of the crystal fiber 21 must be larger than the diameter of the crystal fiber 21 in order to fabricate a perfect periodic polarization inversion structure. Therefore, if an external electric field adjusted according to FIG. 3 is applied to the crystal fiber 21, the value of the amplitude of the micro-swing can be controlled efficiently to be larger than the diameter of the crystal fiber 21 and to be constant, as shown in FIG. 4.

Although the value of the amplitude of the micro-swing can be controlled efficiently, the intensity of the external electric field cannot be constant and must be adjusted to a small value when the crystal fiber 21 elongates. Hence, if the intensity of the external electric field is smaller than that of the required electric field for poling, the crystal fiber 21 will not have a periodic polarization inversion structure. Therefore, the length of the periodic polarization inversion structure formed by the conventional apparatus 10 is limited.

Consequently, there is an existing need for a novel, improved method and an apparatus for fabricating a crystal fiber to solve the above-mentioned problems.

SUMMARY OF THE INVENTION

One objective of the present invention is to provide an apparatus and method for creating different regions of polarization inversion on the ferroelectric crystalline material. A significant advantage of the present invention over prior art is that it can control the growth condition of the crystal fiber precisely so as to fabricate a uniformly and regularly periodic polarization inversion structure. Additionally, the length of the periodic polarization inversion structure formed by the present invention is longer than that formed by the conventional art.

Another objective of the present invention is to provide an apparatus and method for fabricating a crystal fiber that has different regions of polarization inversion and has the advantages of high quality and high coupling efficiency so that it is used for applications in wavelength converter and visible light generation.

Yet another objective of the present invention is to provide a method for fabricating a crystal fiber having different regions of polarization inversion, comprising:

(a) providing a source material;

(b) putting the source material into a fabricating apparatus; and (c) forming the crystal fiber from the source material and applying a first external electric field and a second external electric field on the grown crystal fiber during the growth procedure of the crystal fiber, wherein the first external electric field is applied on a molten zone between the source material and the crystal fiber so as to induce micro-swing of the crystal fiber for polarization inversion, and the second external electric field is applied on a predetermined position above the first external electric field to control and maintain the amplitude of the micro-swing.

Still another objective of the present invention is to provide an apparatus for making a source material into a crystal fiber having different regions of polarization inversion. The apparatus of the present invention comprises a laser beam generator, a beam splitter, a bending mirror, a paraboloidal mirror, a first electric field generating device and a second electric field generating device.

The laser beam generator is used for generating a laser beam. The beam splitter is used for splitting the laser beam into a generally annular beam. The bending mirror is used for reflecting the annular beam from the beam splitter. The paraboloidal mirror is used for reflecting the annular beam from the bending mirror, and focusing the annular beam on a molten zone between the source material and the crystal fiber. The first electric field generating device is disposed near the molten zone for providing a first external electric field which is used for poling the crystal fiber and inducing micro-swing of the crystal fiber. The second electric field generating device is disposed on a predetermined position above the first electric field generating device for providing a second external electric field to control and maintain the amplitude of the micro-swing.

BRIEF DESCRIPTION OF THE DRAWINGS

FIGS. 2a to 2c show a micro-swing occurred during the growth of a crystal fiber, wherein FIG. 2b shows the appearance of the crystal fiber without being applied by any external electric field, FIG. 2a shows that the crystal fiber swings to the left when being applied by an external electric field, and FIG. 2c shows that the crystal fiber swings to the right when being applied by an external electric field;

DETAILED DESCRIPTION OF THE INVENTION

Figure 1:
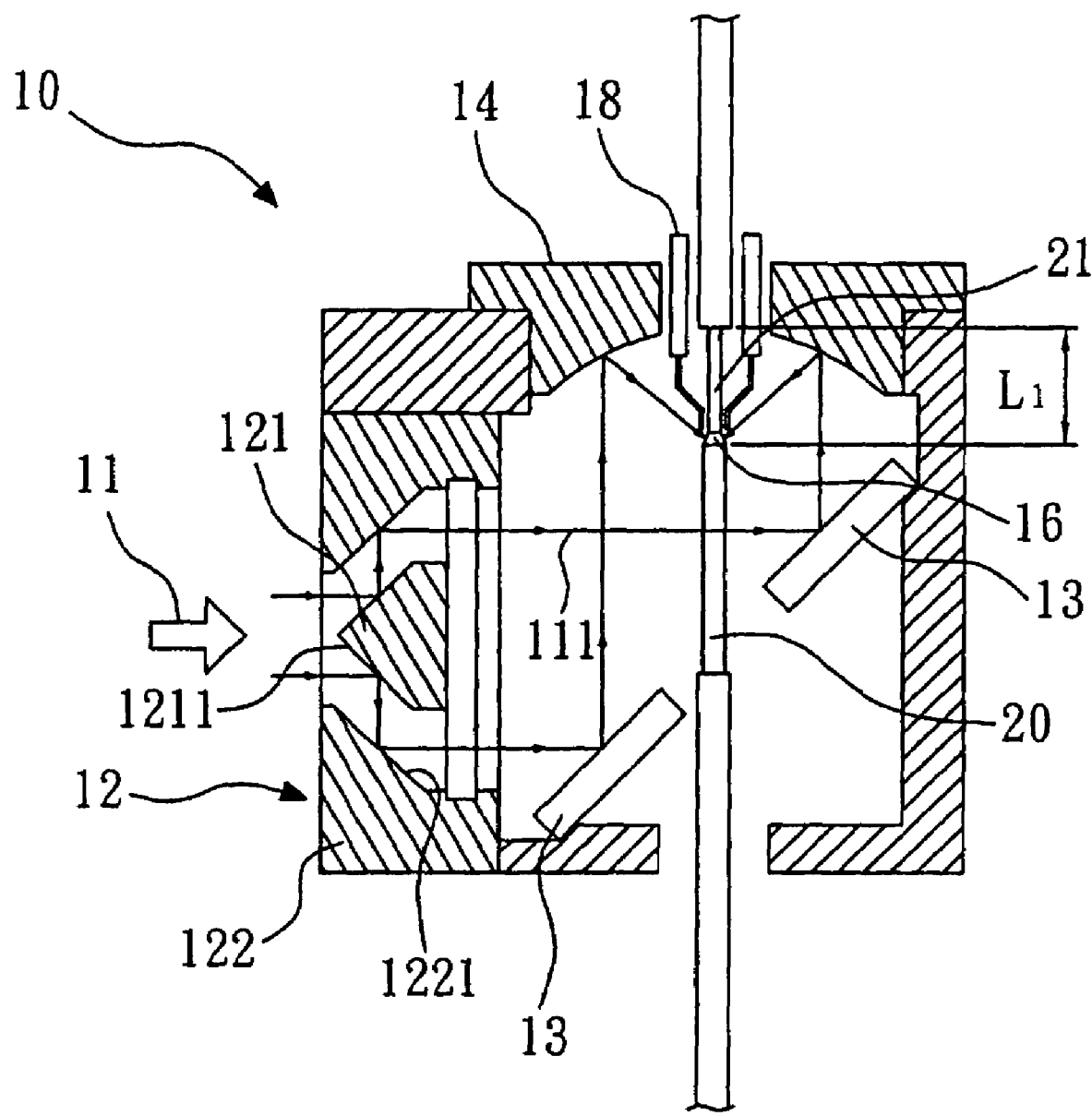
FIG. 1 shows a schematic diagram of a conventional apparatus for fabricating a crystal fiber.
Figure 2A:
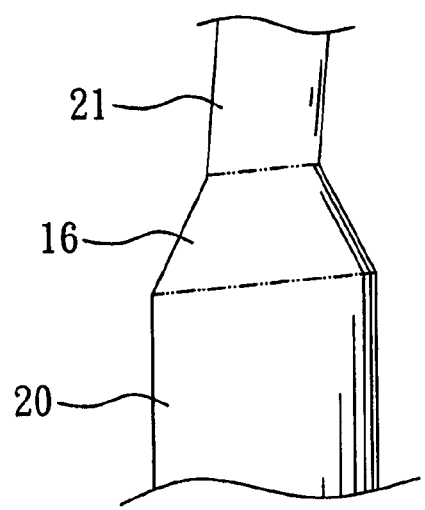
Figure 2B:
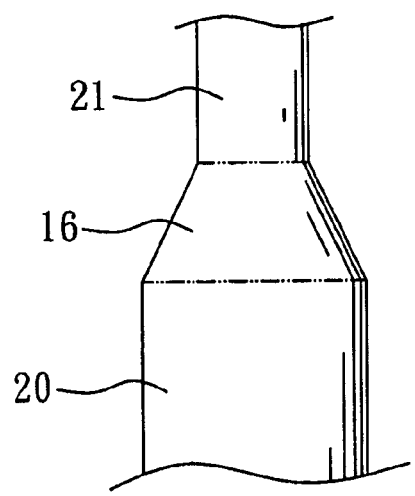
Figure 2C:
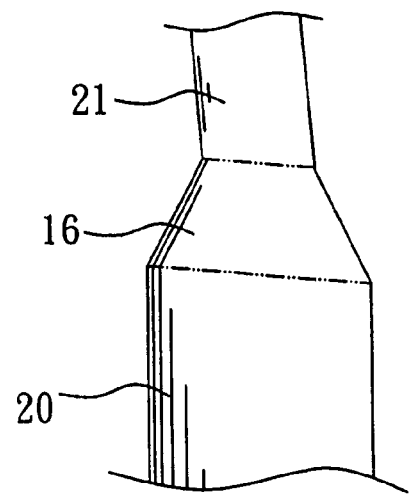
Figure 3:
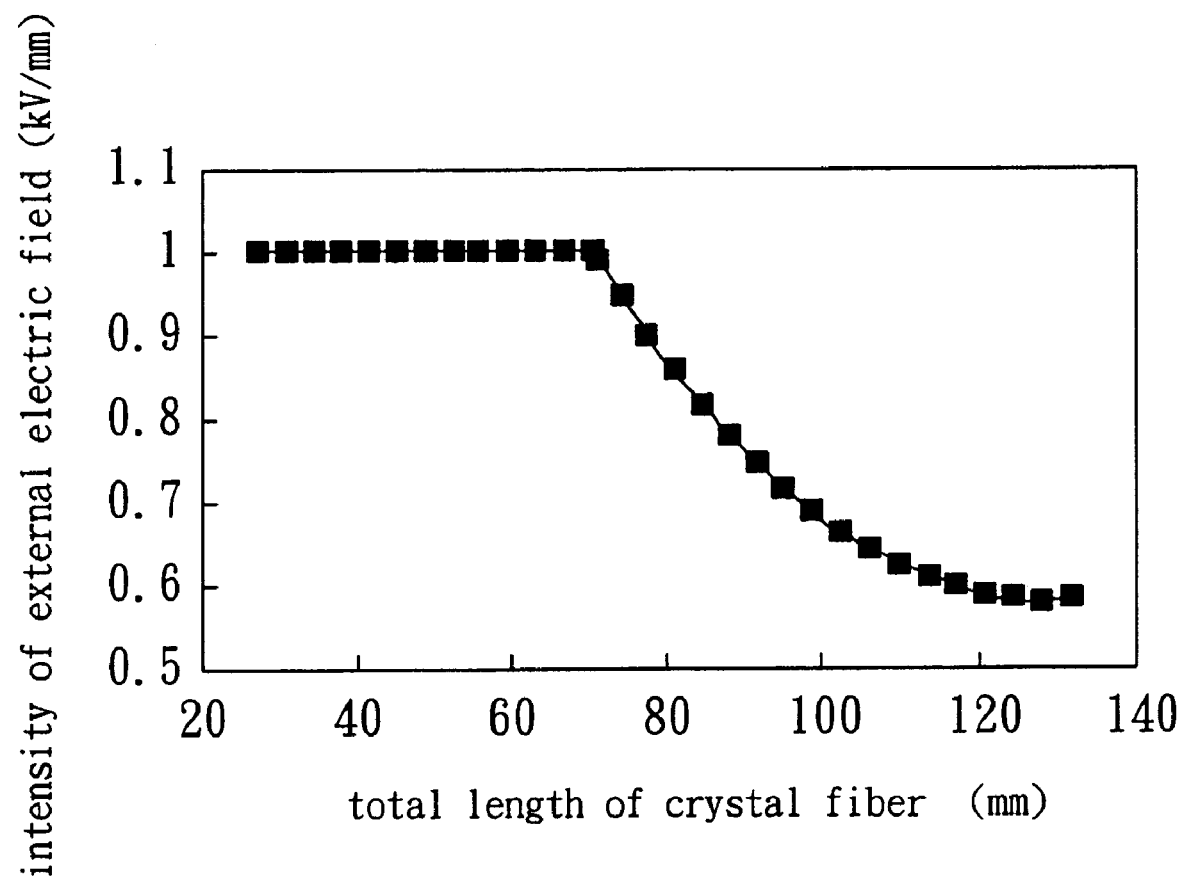
FIG. 3 shows a relationship between the intensity of the external electric field and the total length of the crystal fiber in the conventional apparatus.
Figure 4:
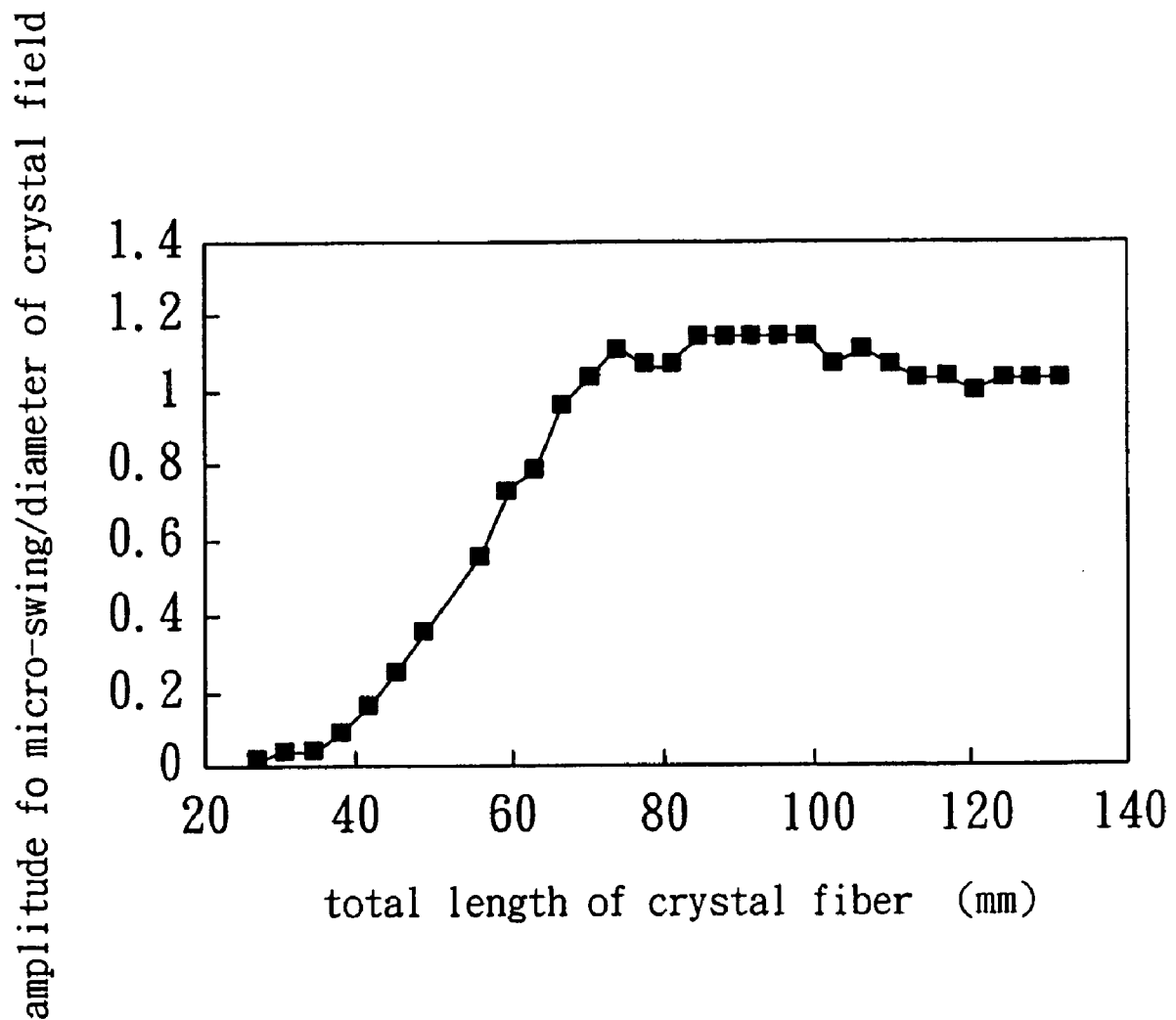
FIG. 4 shows a relationship between the amplitude of the micro-swing and the total length of the crystal fiber in the conventional apparatus.
Figure 5:
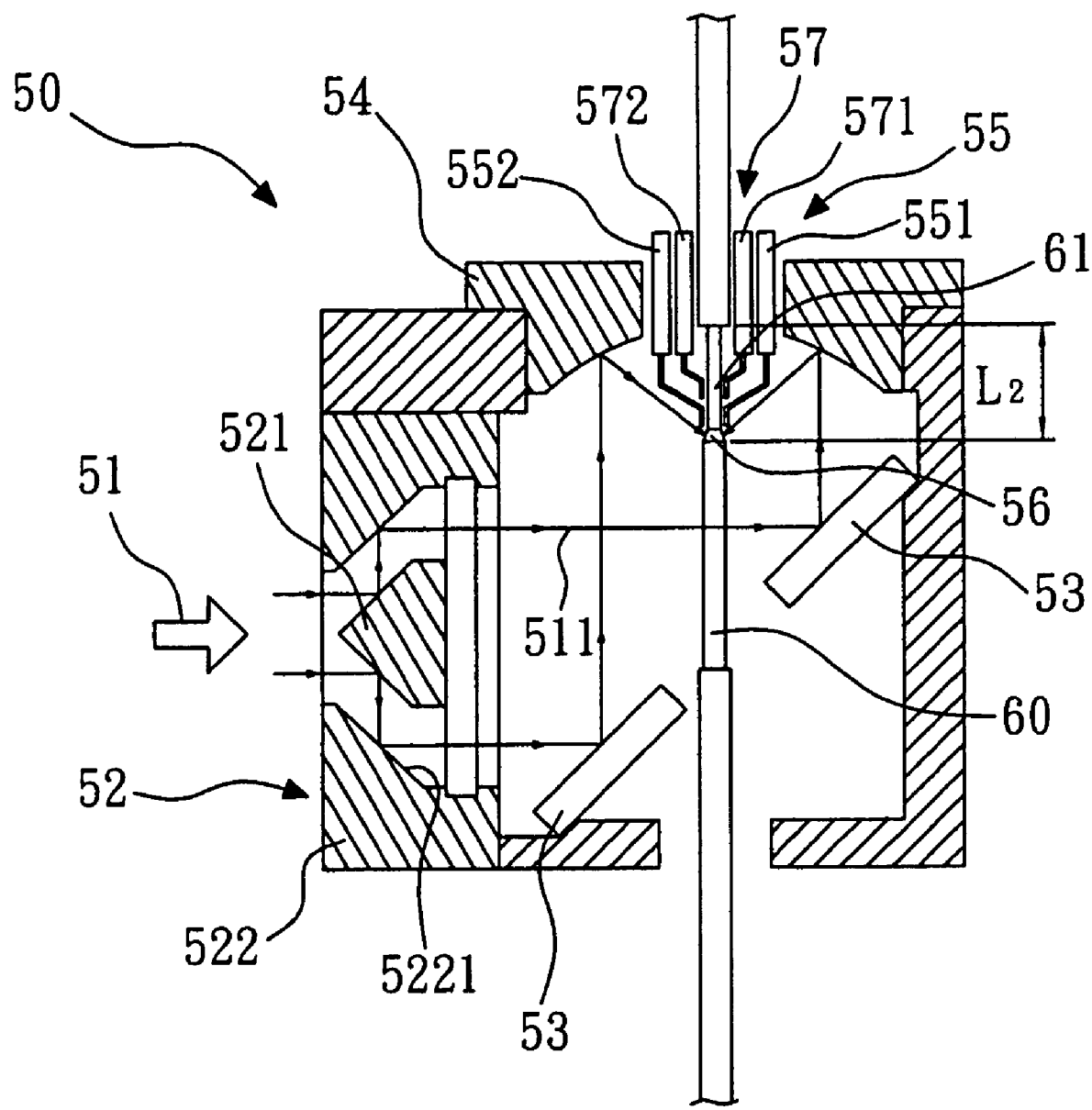
FIG. 5 shows a schematic diagram of a chamber of an apparatus for fabricating a crystal fiber according to the present invention.

FIG. 5 shows a schematic diagram of a chamber of an apparatus for fabricating a crystal fiber according to the present invention. The apparatus 50 is similar to a laser-heated pedestal growth (LHPG) apparatus, which is used for making a source material into a crystal fiber 61 having different regions of polarization inversion. The material of the source material may be crystal (for example, a source crystal rod 60) or powder. The material of the source crystal rod 60 is ferroelectric and is selected from the group consisting of lithium niobate ($LiNbO_3$), lithium tantalate ($LiTaO_3$), patassium titanyl phosphate (KTP) and a dopant therein. The dopant is selected from the group consisting of the oxidation states of magnesium, zinc, yttrium, neodymium and erbium, and the mixture thereof. In the embodiment, the material of the source crystal rod 60 is lithium niobate doped with 6% mol of zinc oxide (ZnO). The apparatus 50 comprises a laser beam generator (not shown), a beam splitter 52, a bending mirror 53, a paraboloidal mirror 54, a first electric field generating device 55 and a second electric field generating device 57.

The laser beam generator is used for generating a laser beam 51. The beam splitter 52 includes an outer cone 521 and an inner cone 522. The outer cone 5121 has a first conical surface 5211 and the inner cone 522 has a second conical surface 5221. The beam splitter 52 is used for splitting the laser beam 51 into a generally annular beam 511. The bending mirror 53 is used for reflecting the annular beam 511 from the beam splitter 52 and projecting it to the paraboloidal mirror 54. The paraboloidal mirror 54 is used for reflecting the annular beam 511 from the bending mirror 53, and focusing the annular beam 511 on the molten zone 56 at the tip of the source crystal rod 60.

The first electric field generating device 55 includes a first right electrode 551 and a first left electrode 552, and is used for providing a first external electric field. The first external electric field is applied on the molten zone 56 to induce micro-swing of the crystal fiber 61. The second electric field generating device 57 includes a second right electrode 571 and a second left electrode 572, and is used for providing a second external electric field. The second external electric field is applied on a predetermined position above the first external electric field to control and maintain the amplitude of the micro-swing.

Figure 6:
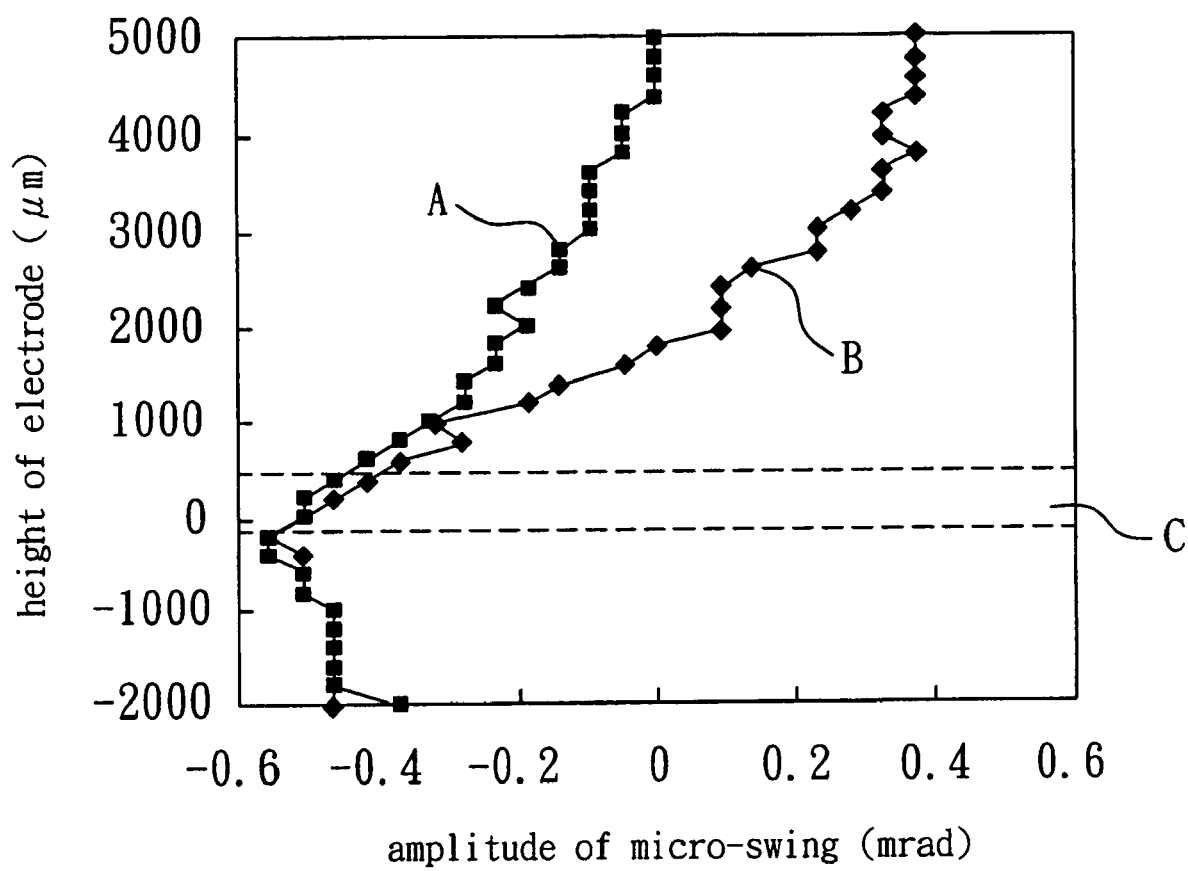
FIG. 6 shows a relationship between the amplitude of the micro-swing and the height of the electrode from the bottom of the molten zone when the external electric field is maintained at 1 kV/mm.

FIG. 6 shows a relationship between the amplitude of the micro-swing and the height of the electrode from the bottom of the molten zone 56 when the external electric field is maintained at 1 kV/mm, wherein the positive amplitude means that the molten zone 56 swings to the right, and the negative amplitude means that the molten zone 56 swings to the left. In order to control the value of the amplitude of the micro-swing by utilizing the second electric field generating device 57 (the second right electrode 571 and the second left electrode 572), it is necessary to know the relationship between the amplitude of the micro-swing and the height of the electrode. In FIG. 6, curve A designates that the second right electrode 571 having a direct current of −1.5 kV and the second left electrode 572 having a direct current of 1.5 kV; curve B designates that the second right electrode 571 having a direct current of −3.0 kV and the second left electrode 572 having a direct current of 0 kV. Both curves A and B have the same electric potential difference of 3 KV.

As shown in FIG. 6, when the electrode is disposed under the molten zone 56 (area C), the molten zone 56 is attracted by positive electric field and distracted by negative electric field, which causes the amplitude of the curves A and B to be all negative value. This is because when the lithium niobate crystal is heated to the melting state, free negative charges will be induced and distributed on the circumference of the molten zone 56. But, such an effect will decrease gradually when the height of electrode increases gradually, and the crystal fiber 61 is attracted by both positive and negative electric fields. This is because that the charges with opposite electrical property to the external field are induced on the circumference of the crystal fiber 61. Therefore, if the external electric field is positive, the crystal fiber 61 is attracted by that positive external electric field; if the external electric field is negative, the crystal fiber 61 is attracted by that negative external electric field. Accordingly, in the embodiment, the second electric field generating device 57 (the second right electrode 571 and the second left electrode 572) is disposed on 2 to 10 mm, preferably 5 mm, above the molten zone 56, and the gap between the two electrodes 571, 572 is about 1 mm. A suitable external electric field can be generated by providing two electrodes 571,572 with adequate electric potential.

Figure 7:
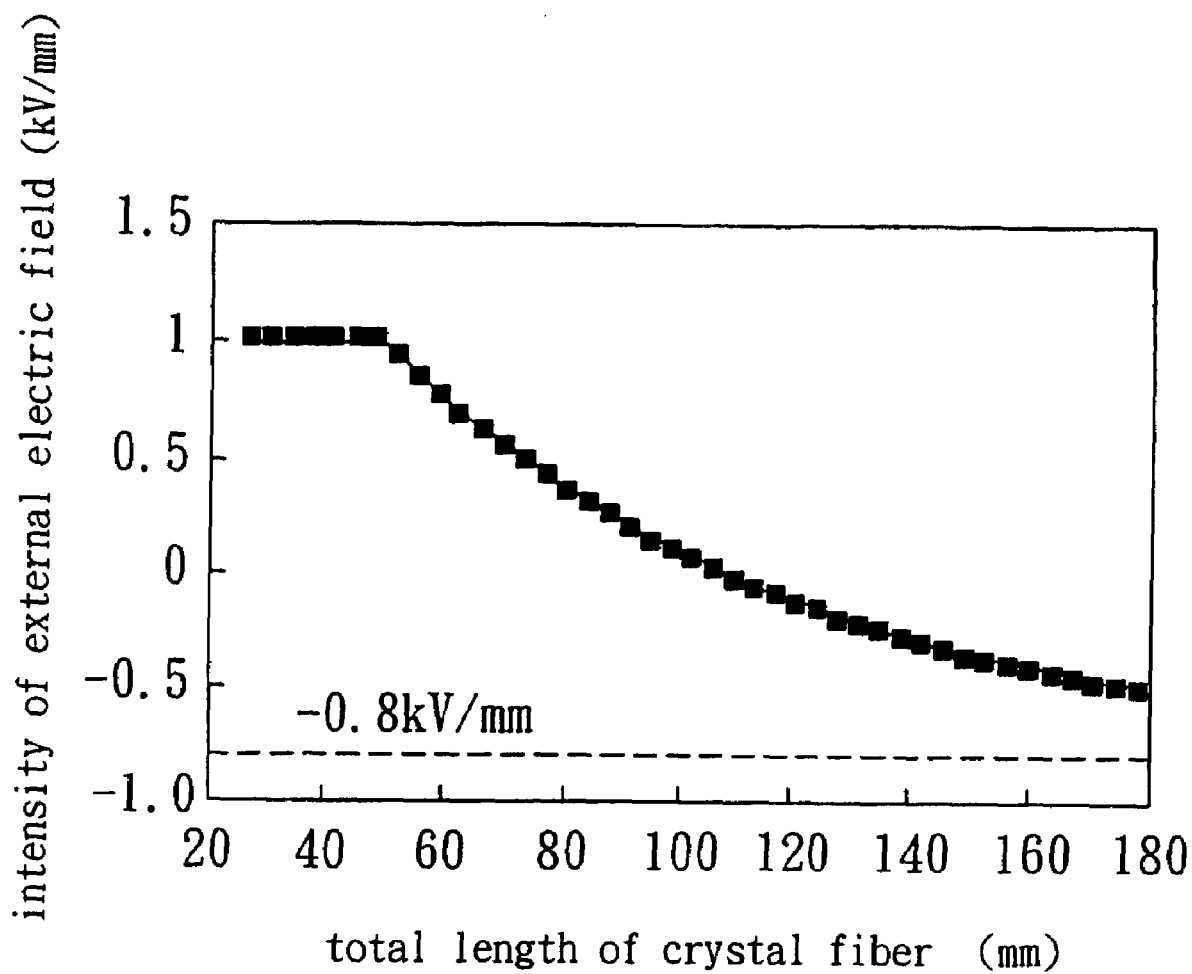
FIG. 7 shows a relationship between the intensity of the external electric field provided by the second electric field generating device and the total length of the crystal fiber according to the present invention.

FIG. 7 shows a relationship between the intensity of the external electric field provided by the second electric field generating device 57 and the total length of the crystal fiber 61 according to the present invention. The total length L2 of the crystal fiber 61 is the length of the crystal fiber 61 from the molten zone 56. As shown in the figure, the curve of the relationship is an exponential-like binding curve that approaches −0.8 kV/mm, which means that the amplitude of the micro-swing of the crystal fiber 61 can be maintained at a constant value which is larger than the diameter of the crystal fiber 61. Preferably, the ratio of the amplitude of the micro-swing to the diameter of the crystal fiber 61 is 1.0 to 1.5.

Figure 8:
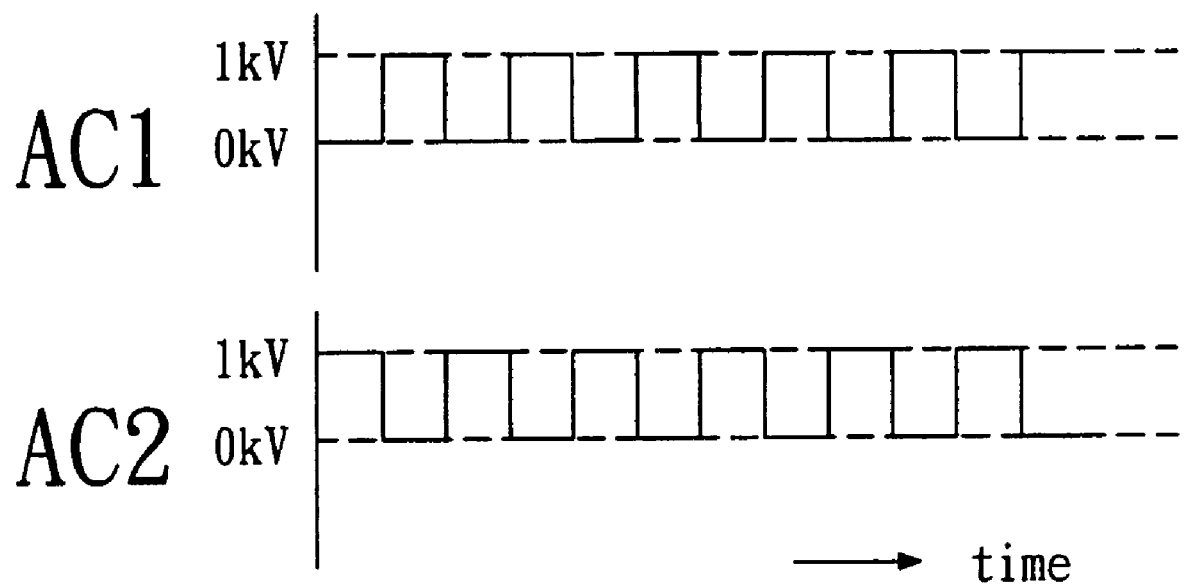
FIG. 8 shows an external electric field provided by the second electric field generating device according to the present invention.

FIG. 8 shows an external electric field provided by the second electric field generating device 57 according to the present invention, wherein AC1 is a first periodic voltage from zero to positive electric potential provided by the second right electrode 571, AC2 is a second periodic voltage whose phase is reverse to that of the first periodic voltage. Such an arrangement can avoid the situation that the crystal fiber 61 is attracted by both one positive electric field and one negative electric field provided by two electrodes on two sides thereof. Additionally, the first electric field generating device 55 (the first right electrode 551 and the first left electrode 552) provides the first external electric field whose intensity is a constant value of about 0.8 kV/mm, which can make the crystal fiber 61 have a polarization inversion structure by the periodic external electric field.

The present invention also relates to a method for fabricating a crystal fiber having different regions of polarization inversion. The method comprises the following steps:

(a) A source material is provided, wherein the material of the source material may be crystal (for example, a source crystal rod) or powder. The material of the source crystal rod is ferroelectric and is selected from the group consisting of lithium niobate (LiNbO$_3$), lithium tantalate (LiTaO$_3$), patassium titanyl phosphate (KTP) and a dopant therein. The dopant is selected from the group consisting of the oxidation states of magnesium, zinc, yttrium, neodymium and erbium, and the mixture thereof.

(b) The source material is put into a fabricating apparatus, wherein the fabricating apparatus is a laser heated pedestal growth (LHPG) apparatus.

(c) The crystal fiber is formed from the source material. During the growth procedure of the crystal fiber, a first external electric field and a second external electric field are applied on the grown crystal fiber, wherein the first external electric field is applied on a molten zone between the source material and the crystal fiber so as to induce micro-swing of the crystal fiber for polarization inversion, and the second external electric field is applied on a predetermined position, preferably 2 to 10 mm, above the first external electric field to control and maintain the amplitude of the micro-swing.

Preferably, the first external electric field and the second external electric field are alternating electric fields, and the intensity of the first external electric field is a constant value. The period of the second external electric field is the same as that of the first external electric field, and the second external electric field is used to control the amplitude of the micro-swing to maintain a constant value that is larger than the diameter of the crystal fiber. Preferably, the ratio of the amplitude of the micro-swing to the diameter of the crystal fiber is 1.0 to 1.5.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method for fabricating a crystal fiber having different regions of polarization inversion, comprising:
   (a) providing a source material;
   (b) putting the source material into a fabricating apparatus; and
   (c) forming the crystal fiber from the source material and applying a first external electric field and a second external electric field on the grown crystal fiber during the growth procedure of the crystal fiber, wherein the first external electric field is applied on a molten zone between the source material and the crystal fiber so as to induce micro-swing of the crystal fiber for polarization inversion, and the second external electric field is applied on a predetermined position above the first external electric field to control and maintain the amplitude of the micro-swing.

2. The method according to claim 1, wherein the fabricating apparatus is a laser-heated pedestal growth (LHPG) apparatus.

3. The method according to claim 1, wherein the first external electric field and the second external electric field are alternating electric fields.

4. The method according to claim 1, wherein the material of the source material is ferroelectric material.

5. The method according to claim 4, wherein the material of the source material is selected from the group consisting of lithium niobate (LiNbO$_3$), lithium tantalate (LiTaO$_3$), patassium titanyl phosphate (KTP) and a dopant therein.

6. The method according to claim 5, wherein the dopant is selected from the group consisting of the oxidation states of magnesium, zinc, yttrium, neodymium and erbium, and the mixture thereof.

7. The method according to claim 1, wherein the second external electric field is applied 2 to 10 mm above the first external electric field.

8. The method according to claim 1, wherein the period of the second external electric field is the same as that of the first external electric field, and the second external electric field is used to control the amplitude of the micro-swing to maintain a constant value that is larger than the diameter of the crystal fiber.

9. The method according to claim 1, wherein the ratio of the amplitude of the micro-swing to the diameter of the crystal fiber is 1.0 to 1.5.

10. The method according to claim 1, wherein the intensity of the first external electric field is a constant value.

11. An apparatus for making a source material into a crystal fiber having different regions of polarization inversion, comprising:

a laser beam generator for generating a laser beam;

a beam splitter for splitting the laser beam into a generally annular beam;

a bending mirror for reflecting the annular beam from the beam splitter;

a paraboloidal mirror for reflecting the annular beam from the bending mirror, and focusing the annular beam on a molten zone between the source material and the crystal fiber;

a first electric field generating device disposed near the molten zone for providing a first external electric field on the molten zone to pole the crystal fiber and induce micro-swing of the crystal fiber; and a second electric field generating device disposed on a predetermined position above the first electric field generating device for providing a second external electric field to control and maintain the micro-swing.

12. The apparatus according to claim 11, wherein the first electric field generating device comprises a first right electrode and a first left electrode.

13. The apparatus according to claim 11, wherein the second electric field generating device comprises a second right electrode and a second left electrode, wherein the second right electrode provides a first periodic voltage from zero to positive potential, the second left electrode provides a second periodic voltage whose phase is reverse to that of the first periodic voltage.

14. The apparatus according to claim 11, wherein the first electric field generating device and the second electric field generating device provide alternating electric fields.

15. The apparatus according to claim 11, wherein the material of the source material is ferroelectric material.

16. The apparatus according to claim 15, wherein the material of the source material is selected from the group consisting of lithium niobate ($LiNbO_3$), lithium tantalate ($LiTaO_3$), patassium titanyl phosphate (KTP) and a dopant therein.

17. The apparatus according to claim 16, wherein the dopant is selected from the group consisting of the oxidation states of magnesium, zinc, yttrium, neodymium and erbium, and the mixture thereof.

18. The apparatus according to claim 11, wherein the second electric field generating device is disposed 2 to 10 mm above the first electric field generating device.

19. The apparatus according to claim 11, wherein the period of the second external electric field is the same as that of the first external electric field, and the second external electric field is used to control the amplitude of the micro-swing to maintain a constant value that is larger than the diameter of the crystal fiber.

20. The apparatus according to claim 19, wherein the ratio of the amplitude of the micro-swing to the diameter of the crystal fiber is 1.0 to 1.5.

* * * * *